US008828274B2

(12) United States Patent
Benson-Smith et al.

(10) Patent No.: US 8,828,274 B2
(45) Date of Patent: Sep. 9, 2014

(54) POLYARYLAMINE KETONES

(75) Inventors: Jessica Benson-Smith, Pittsburgh, PA (US); Christopher T. Brown, Pittsburgh, PA (US); Venkataramanan Seshadri, Monroeville, PA (US); Jing Wang, Gibsonia, PA (US)

(73) Assignee: Solvay USA, Inc., Cranbury, NJ (US)

( * ) Notice: Subject to any disclaimer, the term of this patent is extended or adjusted under 35 U.S.C. 154(b) by 791 days.

(21) Appl. No.: 12/606,162

(22) Filed: Oct. 26, 2009

(65) Prior Publication Data

US 2010/0108954 A1 May 6, 2010

Related U.S. Application Data

(60) Provisional application No. 61/108,851, filed on Oct. 27, 2008.

(51) Int. Cl.

| H01B 1/00 | (2006.01) |
|---|---|
| H01L 29/08 | (2006.01) |
| B32B 9/00 | (2006.01) |
| H01L 51/00 | (2006.01) |
| C09D 11/00 | (2014.01) |
| H01L 51/42 | (2006.01) |
| C08L 79/02 | (2006.01) |
| C08G 73/02 | (2006.01) |
| H01L 51/50 | (2006.01) |

(52) U.S. Cl.
CPC ............ *H01L 51/0035* (2013.01); *C09D 11/52* (2013.01); *H01L 51/5088* (2013.01); *H01L 51/424* (2013.01); *C08L 79/02* (2013.01); *H01L 51/0081* (2013.01); *C08G 2261/512* (2013.01); *H01L 51/0004* (2013.01); *C08G 2261/312* (2013.01); *H01L 51/0085* (2013.01); *C08G 73/026* (2013.01)

USPC .............................. 252/500; 428/690; 257/40

(58) Field of Classification Search
USPC ................... 252/500–521.6; 257/40; 528/423
See application file for complete search history.

(56) References Cited

U.S. PATENT DOCUMENTS 3,637,606 A * 1/1972 Morgan ......................... 528/315
4,356,429 A 10/1982 Tang
(Continued)

FOREIGN PATENT DOCUMENTS

EP 0 052 961 A1 6/1982
EP 0 910 099 A1 4/1999
(Continued)

OTHER PUBLICATIONS

Goodson et al., "Regiodefined Poly(N-Arylaniline)s and Donor-Acceptor Copolymers via Palladium-Mediated Amination Chemistry," Macromolecules, 31, pp. 170-1703 (1998).*

(Continued)

*Primary Examiner* — Harold Pyon
*Assistant Examiner* — Jaison Thomas
(74) *Attorney, Agent, or Firm* — The Marbury Law Group, PLLC

(57) ABSTRACT

Polymers comprising a backbone comprising at least one arylamine repeat moiety and at least one linking moiety, wherein the linking moiety does not comprise an aryl moiety. Ink formulations and organic electronic devices such as OLEDs or OPVs can be formed from the polymers and doped polymers. The polymers can be used in a hole injection layer, hole transport layer, a hole extraction layer, or as a host material in an emissive layer. Improved stability can be achieved in organic electronic devices such as OLEDs and OPVs.

14 Claims, 2 Drawing Sheets

(56) References Cited

U.S. PATENT DOCUMENTS

| | | | |
|---|---|---|---|
| 4,539,507 | A | 9/1985 | VanSlyke et al. |
| 5,047,687 | A | 9/1991 | VanSlyke et al. |
| 5,247,190 | A | 9/1993 | Friend et al. |
| 5,401,827 | A | 3/1995 | Holmes et al. |
| 5,454,880 | A | 10/1995 | Sariciftci et al. |
| 5,853,906 | A | 12/1998 | Hsieh et al. |
| 5,968,674 | A | 10/1999 | Hsieh et al. |
| 6,812,399 | B2 | 11/2004 | Shaheen et al. |
| 6,933,436 | B2 | 8/2005 | Shaheen et al. |
| 2005/0187411 | A1 | 8/2005 | Herron et al. |
| 2006/0076050 | A1 | 4/2006 | Williams et al. |
| 2006/0078761 | A1 | 4/2006 | Williams et al. |
| 2006/0175582 | A1 | 8/2006 | Hammond et al. |
| 2007/0207341 | A1 | 9/2007 | Iida et al. |
| 2009/0033208 | A1* | 2/2009 | Nagayama et al. ............ 313/504 |
| 2009/0058269 | A1* | 3/2009 | Ono et al. .................... 313/504 |

FOREIGN PATENT DOCUMENTS

| | | | | |
|---|---|---|---|---|
| EP | 1277824 | A1 * | 1/2003 | ............ C09K 11/06 |
| JP | 2006302636 | A * | 11/2006 | |
| WO | WO 97/33193 | A2 | 9/1997 | |
| WO | WO 2006087945 | A1 * | 8/2006 | |
| WO | WO 2006129589 | A1 * | 12/2006 | |
| WO | WO 2007/133633 | A2 | 11/2007 | |
| WO | WO 2008/018931 | A2 | 2/2008 | |
| WO | WO 2010/059646 | | 11/2009 | |

OTHER PUBLICATIONS

Goodson et al., "Palladium-Catalyzed Synthesis of Pure, Regiodefined Polymeric Triarylamines," J. Am. Chem. Soc., 121, pp. 7527-7539 (1999).*

IUPAC. Compendium of Chemical Terminology, 2nd ed. (the "Gold Book"). Compiled by A. D. McNaught and A. Wilkinson. Blackwell Scientific Publications, Oxford (1997).*

Thelakkat et al. (1998) "Synthesis and Properties of Novel Hole Transport Materials for Electroluminescent Devices," Macromol. Symp., 125, 157-164.

International Search Report and Written Opinion for PCT/US2009/062105.

U.S. Appl. No. 61/043,654, filed Apr. 9, 2008, Williams et al.

U.S. Appl. No. 61/240,137, filed Sep. 4, 2009, Sheina et al.

U.S. Appl. No. 61/241,813, filed Sep. 11, 2009, Brown et al.

U.S. Appl. No. 61/248,335, filed Oct. 2, 2009, Brown et al.

International Search Report and Written Opinion mailed May 12, 2010 in corresponding Application No. PC/US2009/064857.

Allcock, L., Contemporary Polymer Chemistry, 1981.

Billmeyer, F., Textbook of Polymer Science, $3^{rd}$ Ed., 1984.

Bredas, J. et al., *Conjugated Polymers*, Kluwer Academic Press, Dordrecht (1991).

Cheng, Y., "Thermally Cross-Linkable Hole-Transporting Materials on Conducting Polymer: Synthesis, Characterization, and Applications for Polymer Light-Emitting Devices" 20 *Chem. Mater.* 413 (Dec. 29, 2007).

Crivello, J., "The discovery and development of onium salt cationic photoinitiator", 37 *J. of Pol. Sci. Part A, Pol. Chem.* 4241 (1999).

Fukase, A. et al., "High-efficiency organic electroluminescent devices using iridium complex emitter and arylamine-containing polymer buffer layer," 13 *Polymers for Advanced Technologies* 601 (2002).

Jenkins, et al., "Glossary of basic terms in polymer science," 68 *Pure & Appl. Chem.* 2287 (1996).

Kido, J. et al., "Organic electroluminescent device with aromatic amine-containing polymer as a hole transport layer (II): Poly(arylene ether sulfone)-containing tetraphenylbenzidine," 7 *Polym. Adv. Tech.* 31 (1996).

Kraft et al., "Electroluminescent Conjugated Polymers—Seeing Polymers in a New Light," 37 *Angew. Chem. Int. Ed.*, 402 (1998).

Li, Z. et al., *Organic Light-Emitting Materials and Devices*, CRC Press (Taylor and Francis Group, LLC), Boca Raton (2007).

Lim, B. et al., "Synthesis of a New Cross-Linkable Perfluorocyclobutane-Based Hole-Transport Material," 8 *Org. Lett.* 4703 (2006).

Liu, M., "Thermally Cross-Linkable Hole-Transporting Materials for Improving Hole Injection in Multilayer Blue-Emitting Phosphorescent Polymer Light-Emitting Diodes" 41 *Macromolecules* 9570 (Nov. 26, 2008).

Meerheim, R. et al., "Ultrastable and efficient red organic light emitting diodes with doped transport layers," 89 *Applied Physics Letters* 061111-1 (2006).

Olah, A., ed. et al., *Synthetic Fluorine Chemistry*, Wiley-Interscience (1992).

Smith, M. et al., *March's Advanced Organic Chemistry*, 6th ed., Wiley-Interscience (2007).

Sun, N., Organic Photovoltaics, 2005.

\* cited by examiner

POLYARYLAMINE KETONES

RELATED APPLICATIONS

This application claims priority to U.S. provisional application Ser. No. 61/108,851 filed Oct. 27, 2009, which is hereby incorporated by reference in its entirety.

BACKGROUND

Doped arylamine-based hole-injection layers ("HILs") and also hole transport layers ("HTLs") have been shown to improve the operational stability of organic light-emitting diodes ("OLEDs"). See, for example, Meerheim et al., *Applied Physics Letters*, 89, 061111-1 to 061111-3 (2006). It is believed that doping may reduce the charge injection barrier between the anode and the HIL and thereby reduce the operating voltage and electric field. Furthermore, the low energy of doped materials may also help in quenching any unwanted excited states forming in the HTL.

A need generally exists to improve synthetic methods for HIL and/or HTL layers which also can lead to improved device processing and performance. Monomer and polymer stability, as well as device stability, can be an important parameter. For example, poly(arylamines) reported by Iida et al., U.S. Patent Application Pub. No. 2007/0207341 and Kido, J. et al. *Polym. Adv. Tech.*, 1995, 7, 31, use exhaustive preparative methods. Furthermore, these monomers can have variable stability under ambient conditions.

SUMMARY

The present application describes, for example, arylamine polymers, methods of making the same, and compositions and devices formed using the polymers.

One embodiment provides a polymer comprising a backbone comprising at least one arylamine repeat moiety, wherein the backbone comprises both an aryl and an amine of the arylamine, and at least one linking moiety, wherein the linking moiety does not comprise an aryl moiety.

Another embodiment provides a polymer comprising a backbone comprising at least one arylamine repeat moiety, wherein the backbone comprises both an aryl and an amine of the arylamine, and at least one linking repeat moiety, wherein the linking repeat moiety and the amine are separated by only one aryl moiety, as well as ink formulations, blends, and devices comprising the polymer, as well as methods of making and using the polymer.

Another embodiment provides a polymer comprising a backbone comprising at least one arylamine repeat moiety, wherein the backbone comprises both an aryl and an amine of the arylamine, and at least one linking repeat moiety, wherein the backbone is free of oxygen atoms, as well as ink formulations, blends, and devices comprising the polymer, as well as methods of making and using the polymer.

Another embodiment provides a composition comprising a polymer represented by Formula (I):

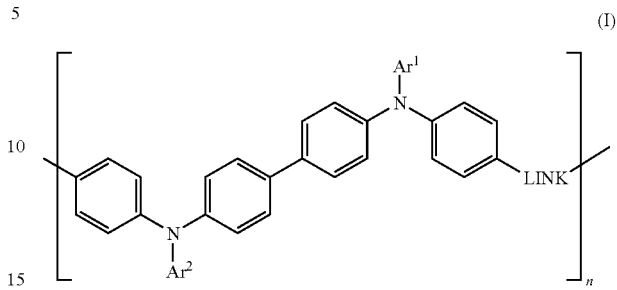

wherein: n is an integer from about 10 to about 500.

$Ar^1$ and $Ar^2$ can be adapted (and substitutents on $Ar^1$ and $Ar^2$ can be adapted) to provide properties such as solubility, morphological and stacking control, electronic control such as electron donation or electronic releasing, and other properties to the polymer and/or backbone. They can be aryl groups.

For example, $Ar^1$ and $Ar^2$ can be, for example, independently selected from benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazole groups and other fused aromatic systems including those groups disclosed in, for example, U.S. Provisional Patent Application Nos. 61/240,137, 61/241,813, and 61/248,335 which are incorporated by reference in their entirety herein; and wherein $Ar^1$ and $Ar^2$ independently can comprise as substituents hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups; and wherein the LINK moiety does not comprise an aryl moiety.

Another embodiment provides a composition comprising a polymer represented Formula (II):

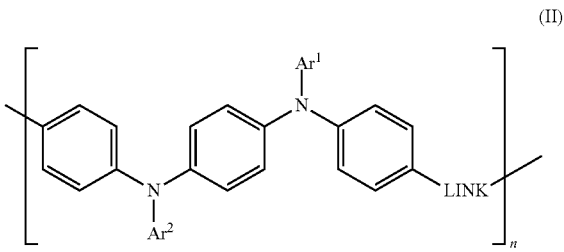

wherein: n can be, for example, an integer from about 10 to about 500; $Ar^1$ and $Ar^2$ can be, for example, independently selected from benzene, naphthalene, anthracene, and phenanthracene groups, and wherein $Ar^1$ and $Ar^2$ independently can comprise substituents such as, for example, hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups; wherein the LINK moiety does not comprise an aryl moiety.

Another embodiment provides a composition comprising a polymer represented by Formula (III):

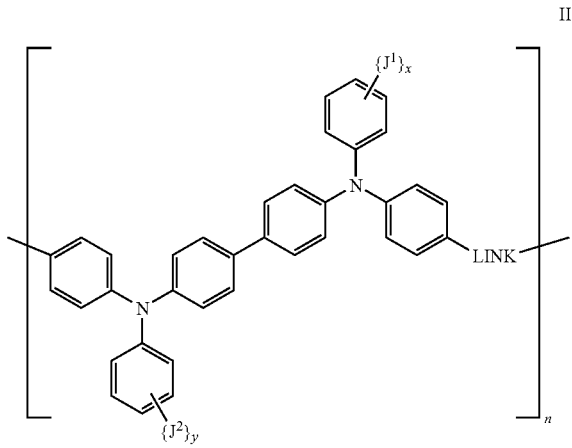

(III)

wherein: n can be an integer from about 10 to about 500; $J^1$ and $J^2$ are independently selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups; x is an integer from 1 to 5, y is an integer from 1 to 5, and wherein the LINK moiety does not comprise an aryl moiety.

Another embodiment provides a composition comprising a polymer of Formula (IV):

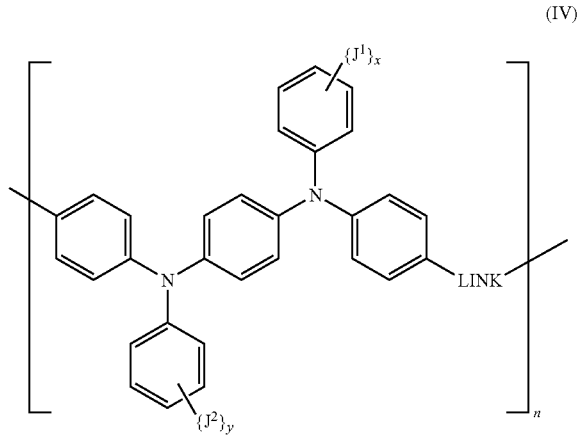

(IV)

wherein: n can be an integer from about 10 to about 500; $J^1$ and $J^2$ are independently selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups, x is an integer from 1 to 5, y is an integer from 1 to 5, and wherein the LINK moiety does not comprise an aryl moiety.

Another embodiment provides a composition comprising: a polymer comprising a backbone comprising at least one arylamine repeat moiety and at least one LINK moiety, wherein the LINK moiety does not comprise an aryl moiety; at least one solvent; and at least one dopant.

Another embodiment provides a device comprising: at least one arylamine polymer; and at least one dopant; wherein the polymer comprises a backbone comprising at least one arylamine repeat moiety and at least one LINK moiety, wherein the LINK moiety does not comprise an aryl moiety.

Another embodiment provides a device comprising: at least one arylamine polymer; and at least one dopant; wherein the device has an efficiency of at least about 3 cd/A.

Another embodiment provides a method of making a polymer comprising: providing at least one first monomer comprising at least one arylamine moiety, wherein the arylamine has two secondary amino groups as polymerization sites, providing at least one second monomer comprising at least one carbonyl or sulfone moiety, wherein the second monomer is adapted to condense with the secondary amino groups of the first monomer, polymerizing the first and second monomer by condensation polymerization so that the polymer backbone comprises the aryl group of the arylamine, the amine group of the arylamine, and the carbonyl or sulfone group.

Another embodiment provides a composition comprising a compound of Formula (V):

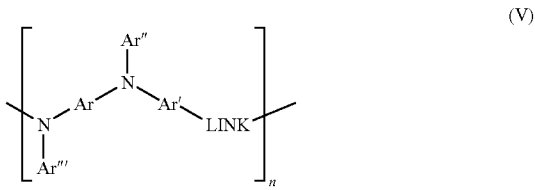

(V)

wherein: n can be an integer from about 10 to about 500; Ar, Ar', Ar'', and Ar''' can be each independently selected from, for example, benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazoles and other fused aromatic systems such as those disclosed in U.S. Provisional Patent Application Nos. 61/240,137, 61/241,813, and 61/248,335 which are incorporated by reference in their entirety herein; each of which may be optionally substituted with substituents such as, for example, hydroxyl, alkoxy, thioalkyl, aryloxy, thioaryl, dialkylamine, diarylamine, cyano, halogen (F, Cl, Br, I), quarternary ammonium salt, sulfonate ester, sulfonate salt, carboxylic ester, ketone, perfluoroalkyl, semifluoroalkyl, perfluoroaryl, semifluoroaryl, alkyl, aryl, alkylsilyl, arylsilyl, alkoxysilyl, aryloxysilyl groups; and wherein the LINK moiety does not comprise an aryl moiety.

Another embodiment provides a polymer consisting essentially of a backbone consisting essentially of at least one arylamine repeat moiety, wherein the backbone consists essentially of both an aryl and an amine of the arylamine, and at least one linking repeat moiety, wherein the linking repeat moiety and the amine are separated by only one aryl moiety.

Another embodiment provides a polymer consisting essentially of a backbone consisting essentially of at least one arylamine repeat moiety, wherein the backbone consists essentially of both an aryl and an amine of the arylamine, and at least one linking repeat moiety, wherein the backbone is free of oxygen atoms.

Another embodiment provides a polymer consisting essentially of a backbone consisting essentially of at least one arylamine repeat moiety, wherein the backbone consists essentially of both an aryl and an amine of the arylamine, and at least one linking repeat moiety, wherein the linking repeat moiety does not comprise an aryl moiety.

At least some of the polymers as described herein provide an advantage of commercially useful synthetic procedure; and/or an advantage of stability; and/or an advantage of ability to provide good performance in a device such as an OLED device.

DETAILED DESCRIPTION

Introduction

Figure 1:
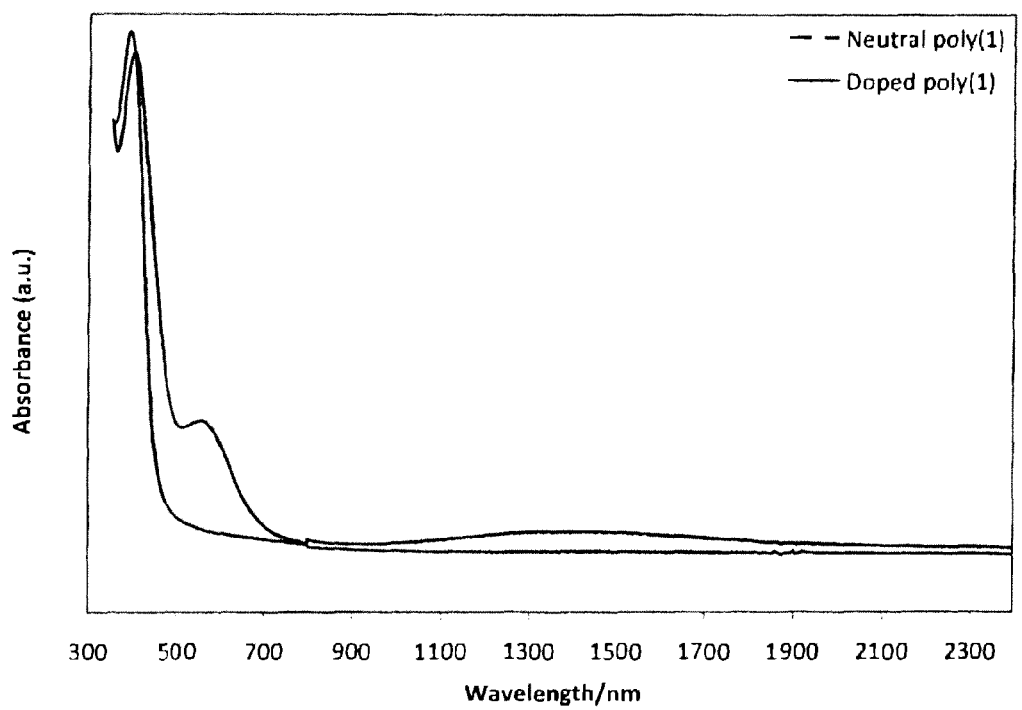
FIG. 1 shows UV-vis-NIR absorption spectra of neutral and doped Poly(1) (working example).
Figure 2:
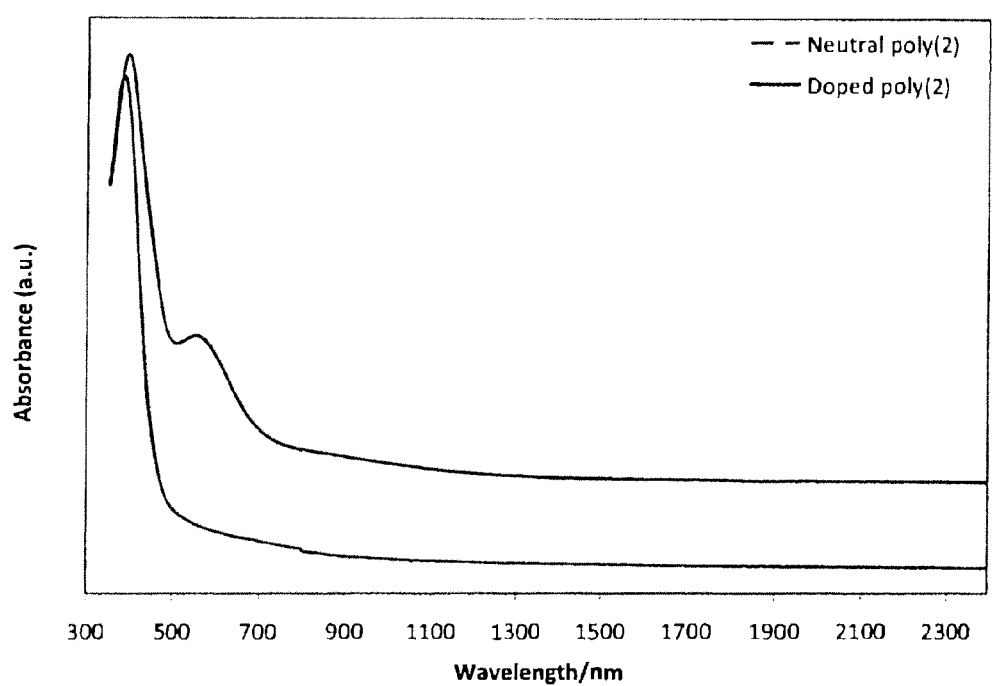
FIG. 2 shows UV-vis-NIR absorption spectra of neutral and doped Poly(2) (working example).

The present application describes arylamine polymers, methods of making the same, and compositions and devices formed using the polymers. The polymers can comprise at least one arylamine moiety and at least one linking moiety, wherein the linking moiety does not comprise an aryl moiety.

A method of making the polymers can comprise co-polymerizing a monomer comprising an arylamine group with a monomer comprising a halogenated or hydroxylated aryl group. The polymers can be used in ink compositions and further used to form functional layers, such as, for example, HILs or HTLs, in various devices.

Polymer

Polymers and copolymers are generally known in the art. See, for example, Billmeyer, *Textbook of Polymer Science*, 3$^{rd}$ Ed., 1984; Allcock, Lampe, *Contemporary Polymer Chemistry*, 1981. Polymers and copolymers can comprise polymeric and copolymeric backbones which further comprise atoms and side groups bonded to the backbone.

The polymers and copolymers can be soluble, linear molecules. The can comprise repeat moieties. For example, in one embodiment, a co-polymer comprises a backbone comprising at least one arylamine repeat moiety and at least one linking repeat moiety. The moieties can be alternating.

Monomer Synthesis

Methods known in the art, including organic synthesis and polymer arts, can be used to prepare monomers comprising polymerizable or reactive functional groups, and then to couple monomers together to form polymers. See, for example, March's *Advanced Organic Chemistry*, 6th Ed, 2007.

Monomers and reactions, including nucleophilic addition reactions, involving fluorinated unsaturated compounds and polymers are known in the art. See, for example, *Synthetic Fluorine Chemistry*, Ed. Olah, 1992.

One first monomer can be adapted to provide a hole injection and/or hole transporting function. Multiple different monomers can be used to provide for this first monomer. One second monomer can be used to provide a spacer function to separate the hole injection and/or hole transport moieties. Multiple different monomers can be used to provide for this second monomer.

The first monomer can be any suitable monomer including at least two amine groups that will yield an arylamine repeat moiety after polymerization is complete. The first monomer can comprise an aromatic group, such as, for example, benzene, naphthalene, anthracene, phenanthracene fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazoles and other fused aromatic systems such as those disclosed in U.S. Provisional Patent Application Nos. 61/240,137, 61/241,813, and 61/248,335 which are incorporated by reference in their entirety herein. The first monomer aromatic group may be unsubstituted, or may be substituted with moieties selected from, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy hydroxyl, thioaryl, dialkylamine, diarylamine, halogen (F, Cl, Br, I), quarternary ammonium salt, sulfonate ester, sulfonate salt, carboxylic ester, ketone, semifluoroalkyl, perfluoroaryl, semi-fluoroaryl, aryl groups, alkylsilyl, arylsilyl, alkoxysilyl, and aryloxysilyl groups. The first monomer can comprise more than one aromatic group, where each aromatic group is independently unsubstituted or substituted with moieties selected from, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups. Monomers can be prepared or obtained which provide an arylamine repeat moiety, such as, for example, N,N'-diphenyl benzidine, or N,N'-diphenyl-1,4-phenylenediamine, N,N'-dinaphthyl benzidine, N,N'-dinaphthyl-1,4-phenylene diamine or dihydrophenazin or indolocarbazole or diarylamino carbazole. Monomers can be prepared or obtained which provide an arylamine repeat moiety, wherein the arylamine repeat moiety comprises at least one aryl group substituted with $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, halogen (F, Cl, Br, I), quarternary ammonium salt, sulfonate ester, sulfonate salt, carboxylic ester, ketone, semifluoroalkyl, perfluoroaryl, semi-fluoroaryl, aryl groups, alkylsilyl, arylsilyl, alkoxysilyl, and aryloxysilyl groups.

The second monomer can be any suitable monomer including at least two halogenated or hydroxylated aryl groups that will yield a linking repeat moiety as claimed. Monomers can be prepared or obtained which can provide a ketone repeat moiety, such as, for example, 4,4'-difluorobenzophenone. Monomers can be prepared or obtained which can provide a sulfone repeat moiety, such as, for example, 4,4'-dichlorosulfone.

Monomers can be bifunctional so that linear, soluble polymers are prepared. For example, an A monomer can be adapted to react with a B monomer to form an A-B copolymer. Or alternatively, A and B can be combined before polymerization to form A-B, and then A-B can be polymerized.

Polymer Synthesis

Polymer synthesis methods are known in the art. See, for example, Billmeyer, *Textbook of Polymer Science,* 3rd Ed., 1984; Allcock, Lampe, *Contemporary Polymer Chemistry,* 1981. Examples include, but are not limited to, step growth, condensation polymerization, addition polymerization, free-radical polymerization, cationic polymerization, anionic polymerization and coordination polymerization. In some embodiments, the polymerization reaction includes the reaction of a compound comprising an arylamine, with a compound comprising halogenated or hydroxylated aryl groups.

In one embodiment, a first monomer comprising at least two amine groups is co-polymerized with a second monomer comprising at least two halogenated or hydroxylated aryl groups to yield a polymer comprising a backbone comprising at least one arylamine repeat moiety and at least one linking repeat moiety, wherein the linking repeat moiety does not comprise an aryl moiety. In addition, the backbone can be free of oxygen atoms. In addition, the backbone can comprise only one aryl group, such as a phenyl rink, between the backbone nitrogen atom and the link moiety.

Polymer Backbone

Polymer backbones are known in the art and are commonly understood to include the main structure of a polymer to which various substituents can be attached as side groups. See, for example, Jenkins et al., *Pure & Appl. Chem.*, Vol. 68, No. 12, pp. 2287-2311, (1996).

In an embodiment, the polymer backbone is free of oxygen atoms. In an embodiment, the polymer backbone comprises only amino groups, aryl groups, and the link moiety, wherein the link moiety can be, for example, carbonyl or sulfone. In a basic and novel embodiment, the polymer backbone is prepared with use of condensation polymerization comprising use of arylamine monomers comprising two secondary amines as the polymerization sites (—NH of secondary amines as polymerization site).

In an embodiment, the polymer can be crosslinked as known in the art, particularly after solution processing. The degree of crosslinking can be adapted for the particular application such as for example HIL or HTL layers.

In an embodiment, branching can be done if desired. If desired, in an embodiment, one or more trifunctional monomers can be used to introduce branching.

Arylamine Repeat Moiety

Arylamine repeat moieties are known in the art. See, for example, Lim et al., *Organic Letters,* 2006, 8, 21, 4703-4706; Fukase et al., *Polymers for Advanced Technologies,* 13, 601-604 (2002). The arylamine moieties can each comprise at least one nitrogen atom and at least one benzene ring so that the polymer backbone can comprise both at least one aryl group and nitrogen atom from the arylamine. The aryl group may also appear in the side group. As a non-limiting example, they can comprise one benzene ring bonded to a nitrogen atom; two benzene rings bonded to a nitrogen atom; or three benzene rings bonded to a nitrogen atom. The arylamine repeat moiety can be formed by any suitable monomer including at least two amine groups that will yield an arylamine repeat moiety after polymerization is complete. The arylamine repeat moiety can comprise an aromatic group, such as, for example, benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, and carbazole groups, and other fused aromatic systems such as those disclosed in U.S. Provisional Patent Application Nos. 61/240,137, 61/241,813, and 61/248,335 which are incorporated by reference in their entirety herein groups. The arylamine repeat moiety aromatic group can be, for example, unsubstituted, or can be, for example, substituted with moieties selected from, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups. The arylamine repeat moiety may commonly comprise N,N'-diphenyl benzidine. The N,N'-diphenyl benzidine aryl groups can be, for example, unsubstituted, or can be, for example, substituted with, as non-limiting examples, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups. Commonly, substitution of an aryl group of N,N'-diphenyl benzidine can involve an aryl group that does not become part of the polymer backbone. The arylamine repeat moiety may commonly comprise N,N'-diphenyl-1,4-phenylenediamine. The N,N'-diphenyl-1,4-phenylenediamine aryl groups can be, for example, unsubstituted, or can be, for example, substituted with, as non-limiting examples, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups. Commonly, substitution of an aryl group of N,N'-diphenyl-1,4-phenylenediamine can involve an aryl group that does not become part of the polymer backbone. In some embodiments, the arylamine repeat moiety can comprise a mixture of arylamine repeat moieties.

Linking Repeat Moiety

The terms "linking repeat moiety," "linking moiety," "spacer," and "LINK" as used herein refer to an atom or collection of atoms used to link arylamine repeat moieties. Linking repeat moieties can be formed by any suitable monomer including at least two halogenated or hydroxylated aryl groups that will yield a linking repeat moiety that does not comprise an aryl moiety after polymerization is complete. The linking moiety may commonly comprise, for example, a bivalent carbonyl group (>C=O) or a bivalent sulfone group (>S(=O)$_2$), or in addition, for example, derivatives of these groups formed by post-polymer functionalization by organic and polymer chemistry methods known in the art. Embodiments include, for example:

>C=NR (imino)>

C=C(CN)R where R can be, for example, H, CN, alkyl, F, wherein an example of alkyl is methyl.

Post Polymerization Reaction

Following polymerization, the linking moiety comprising, for example, a carbonyl group or sulfone group, can be modified by other chemical reactions known in the art. A linking repeat moiety comprising a carbonyl group, for example, may be derivatized by known chemistry, such as, for example, a Knoevenagel reaction. See for example March's Advanced Organic Chemistry, 6$^{th}$ Ed, description of Knoevenagel reactions. Embodiments include, for example, reactions with carbonyl to form carbon-carbon double bonds. Other embodiments include, for example, reaction with malonitriles, reduction, or hydrazone formation to provide more versatility in material choice, improve processibility, and/or change electronic properties of the polymer.

Structures

In one embodiment, a polymer of the present application may have the structure shown in Formula (I):

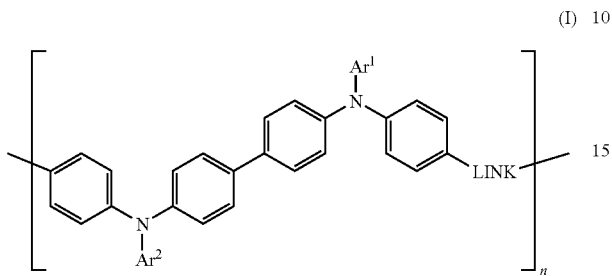

where n is an integer from about 10 to about 500, $Ar^1$ and $Ar^2$ are independently selected from benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazole groups, and other fused aromatic systems such as those disclosed in U.S. Provisional Patent Application Nos. 61/240,137, 61/241,813, and 61/248,335, and where $Ar^1$ and $Ar^2$ are independently substituted with moieties selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, halogen (F, Cl, Br, I), quarternary ammonium salt, sulfonate ester, sulfonate salt, carboxylic ester, ketone, semifluoroalkyl, perfluoroaryl, semi-fluoroaryl, aryl groups, alkylsilyl, arylsilyl, alkoxysilyl, aryloxysilyl groups, and optionally substituted diarylamines, dialkylamines, N-alkyl/aryl carbazole groups, and where the LINK moiety does not comprise an aryl moiety. The LINK moiety may commonly comprise, for example, a carbonyl group, a sulfone group, or an imino group, $>C=NR$ or $>C=C(CN)R$, wherein R is, H, CN, F, or alkyl such as $-CH_3$.

In one embodiment, a polymer of the present application may have the structure shown in Formula (II):

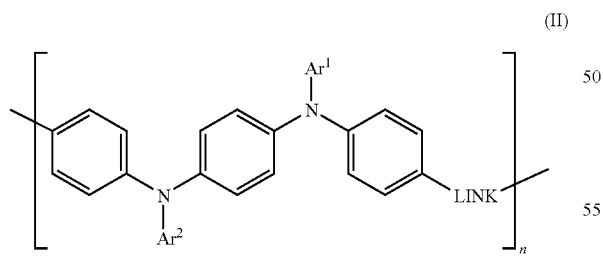

where n is an integer from about 10 to about 500, $Ar^1$ and $Ar^2$ are independently selected from benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazole groups, and other fused aromatic systems such as those disclosed in U.S. Provisional Patent Application Nos. 61/240,137, 61/241,813, and 61/248,335, and where $Ar^1$ and $Ar^2$ are independently substituted with moieties selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups, and where the LINK moiety does not comprise an aryl moiety. The LINK moiety may commonly comprise, for example, a carbonyl group, a sulfone group, or an imino group, $>C=NR$ or $>C=C(CN)R$, wherein R is, H, CN, F, or alkyl such as $-CH_3$.

In one embodiment, a polymer of the present application may have the structure shown in Formula (III):

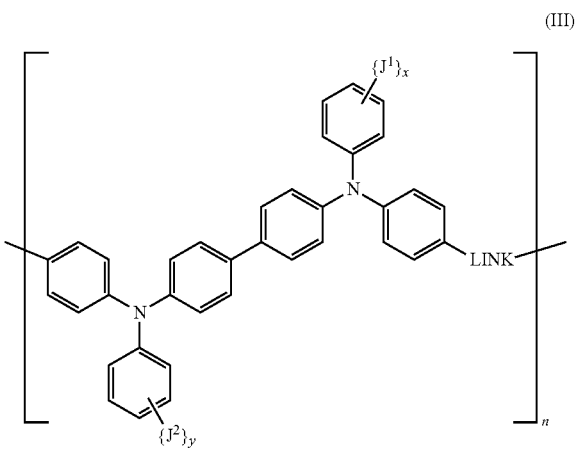

Where n is an integer from about 10 to about 500, $J^1$ and $J^2$ are independently selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups, x is an integer from 1 to 5, y is an integer from 1 to 5, and where the LINK moiety does not comprise an aryl moiety. The LINK moiety may commonly comprise, for example, a carbonyl group, a sulfone group, or an imino group, $>C=NR$ or $>C=C(CN)R$, wherein R is, H, CN, F, or alkyl such as $-CH_3$.

In one embodiment, a polymer of the present application may have the structure shown in Formula (IV):

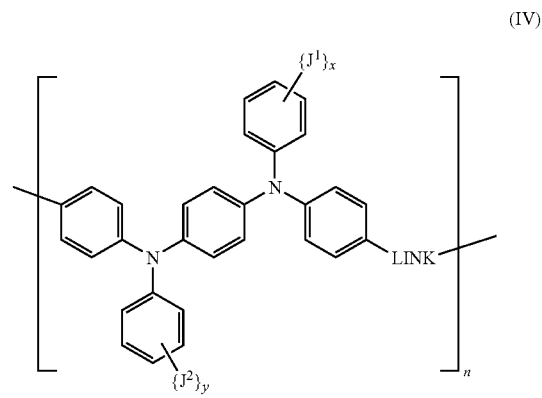

where n is an integer from about 10 to about 500, $J^1$ and $J^2$ are independently selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups, x is an integer from 1 to 5, y is an integer from 1 to 5, and wherein the LINK moiety does not comprise an aryl moiety. The LINK moiety may commonly comprise, for example, a carbonyl group, a sulfone group, or an imino group, >C=NR or >C=C(CN)R, wherein R is, H, CN, F, or alkyl such as —$CH_3$.

Other Embodiments

Additional embodiments include, for example, structures (VI) and (VII) represented below:

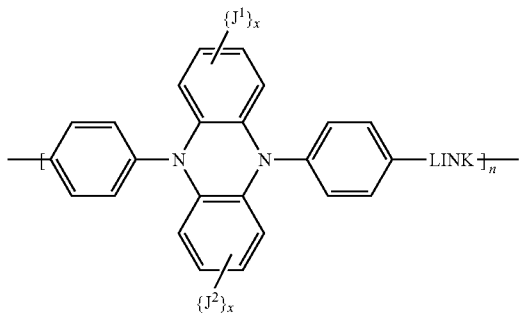

(VI)

where, for example, n is an integer from about 10 to about 500, $J^1$ and $J^2$ are independently selected from hydrogen, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semifluoroaryl, aryl, alkylsilyl, arylsilyl, alkoxysilyl, and aryloxysilyl groups, x is an integer from 1 to 5, y is an integer from 1 to 5, and wherein the LINK moiety does not comprise an aryl moiety.

The LINK moiety may commonly comprise, for example, a carbonyl group, a sulfone group, or an imino group, >C=NR or >C=C(CN)R, wherein R is, H, CN, F, or alkyl such as —$CH_3$.

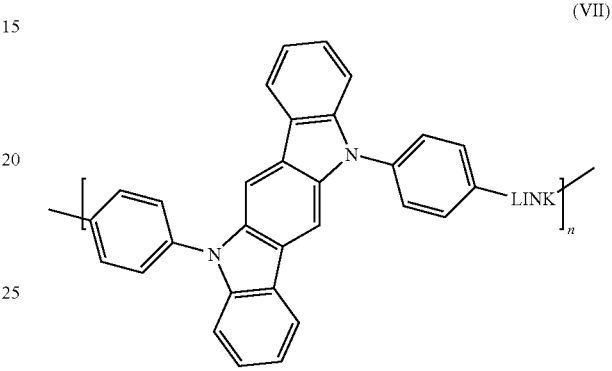

(VII)

In structure VII, the aromatic units can be optionally substituted with substituents as described elsewhere herein for structures (I) to (VI), for example.

Other embodiments are described in, for example, U.S. Provisional Patent Application Nos. 61/240,137, 61/241,813, and 61/248,335 (Plextronics, Inc.) which describe a variety of donor and acceptor ring structures, including heterocyclic structures, which can be incorporated into the polymers described herein.

Methods of Making

A general synthetic scheme for poly(arylamine) ketones and sulfones is shown Scheme 1.

Scheme 1: General synthetic method for making poly(arylamine) ketones and sulfones.

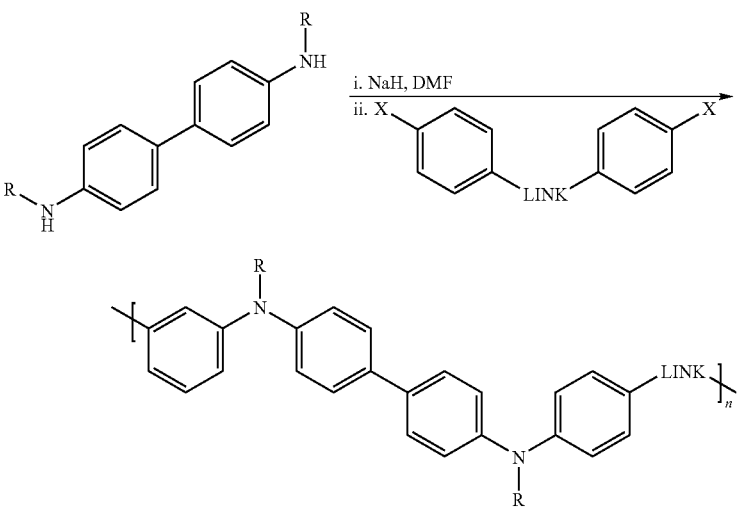

-continued

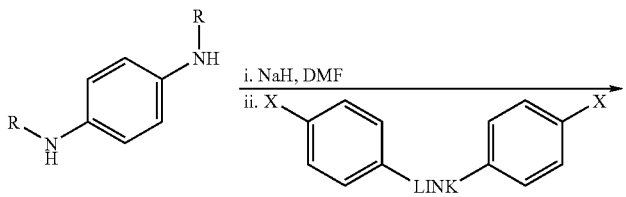

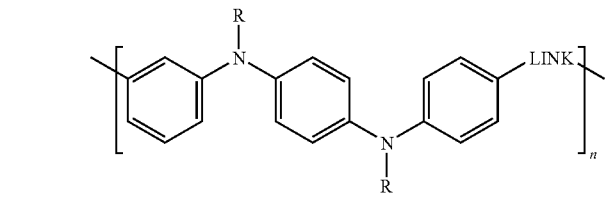

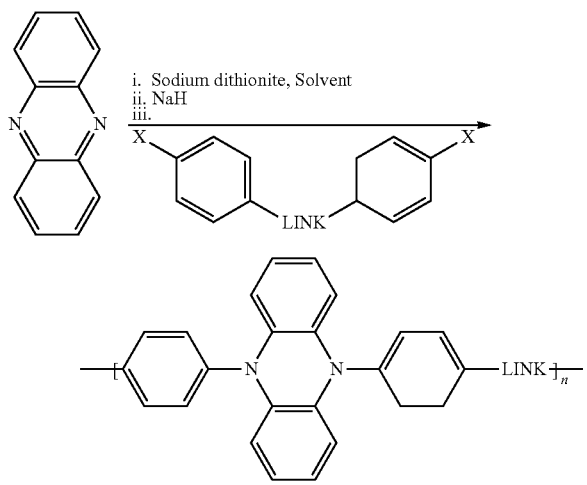

| LINK | X | R |
|---|---|---|
| C=O | F | Substituted or unsubstituted benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazoles or other fused aromatic systems such as those disclosed in U.S. Provisional Patent Application Nos. 61/240,137, 61/241,813, and 61/248,335 |
| $SO_2$ | F, Cl, Br, I | Substituted or unsubstituted benzene, naphthalene, anthracene, or phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazoles or other fused aromatic systems such as those disclosed in U.S. Provisional Patent Application Nos. 61/240,137, 61/241,813, and 61/248,335 |

Substitution on "R" groups can include substitution with, for example, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, and aryloxysilyl groups.

In other embodiments of the present application, more than one arylamine monomer can be used to make the arylamine polymer, as shown in Scheme 2. Commonly, n/(n+m) can range from about 0.05 to about 1.

Scheme 2.

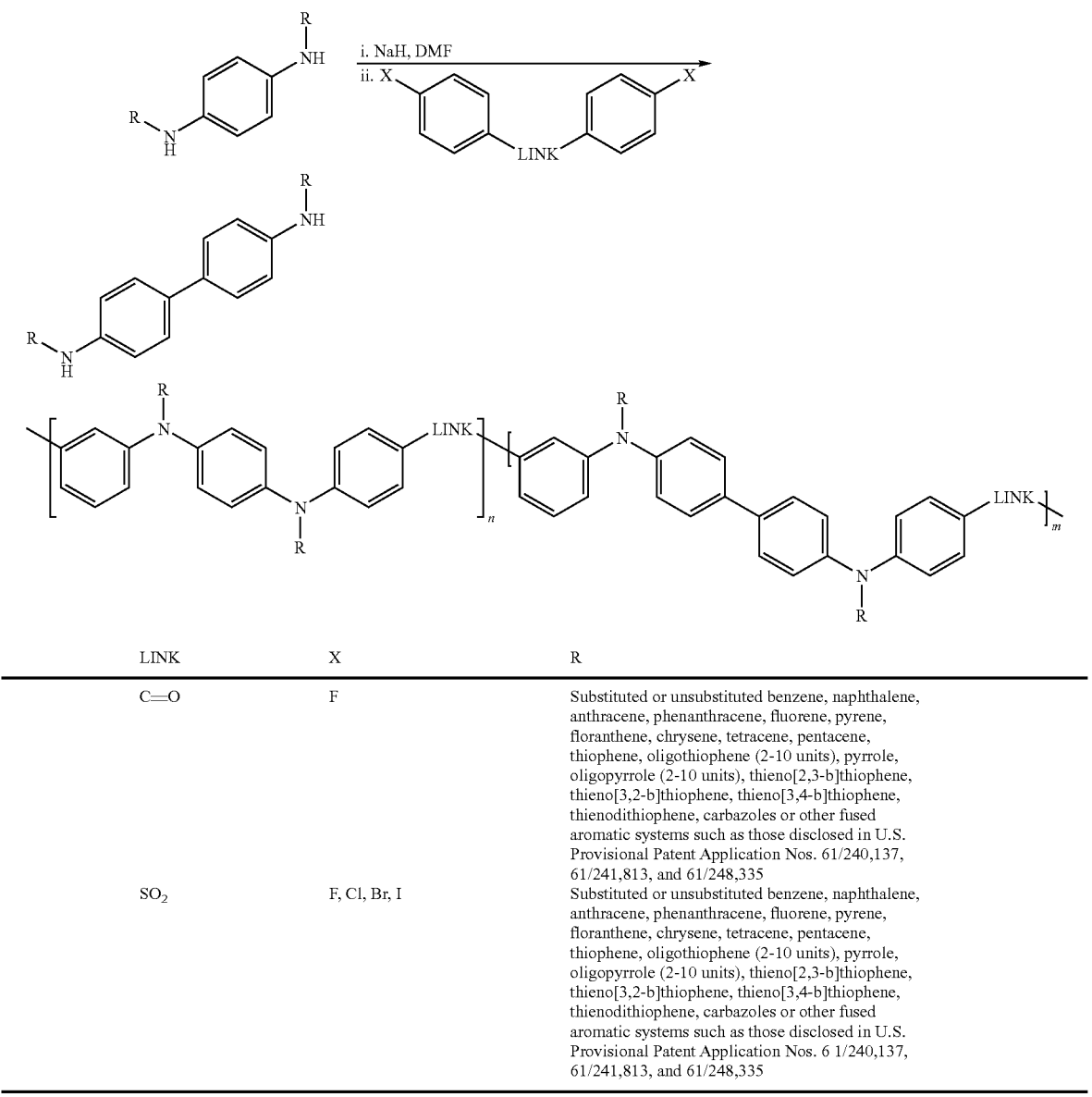

| LINK | X | R |
|------|---|---|
| C=O | F | Substituted or unsubstituted benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazoles or other fused aromatic systems such as those disclosed in U.S. Provisional Patent Application Nos. 61/240,137, 61/241,813, and 61/248,335 |
| $SO_2$ | F, Cl, Br, I | Substituted or unsubstituted benzene, naphthalene, anthracene, phenanthracene, fluorene, pyrene, floranthene, chrysene, tetracene, pentacene, thiophene, oligothiophene (2-10 units), pyrrole, oligopyrrole (2-10 units), thieno[2,3-b]thiophene, thieno[3,2-b]thiophene, thieno[3,4-b]thiophene, thienodithiophene, carbazoles or other fused aromatic systems such as those disclosed in U.S. Provisional Patent Application Nos. 6 1/240,137, 61/241,813, and 61/248,335 |

Substitution on "R" groups can include substitution with, for example, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, and trialkyl silyloxy groups.

In other embodiments of the present application, a dihydroxy aryl monomer can be used as a co-monomer in a one-pot synthesis to provide an arylamine aryl ether ketone or sulfone polymer. Commonly, n/(n+m) can range from about 0.05 to about 1. A general synthetic method using a dihydroxy aryl monomer is shown in Scheme 3.

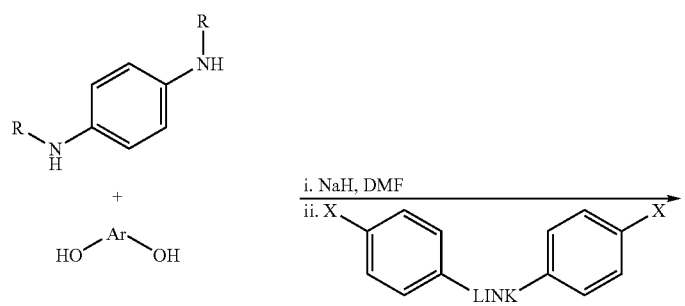

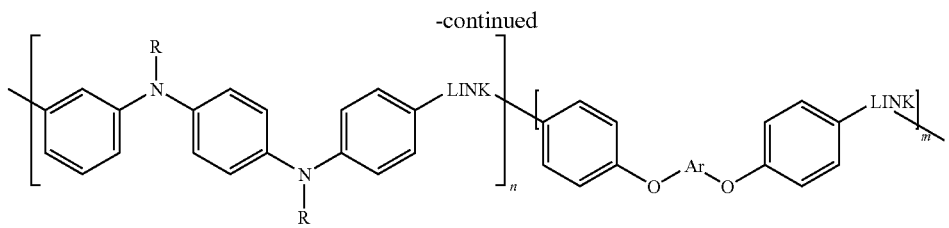

Ar(OH)₂ = dihydroxybenzene (all isomers), dihydroxynaphthalene (all isomers), Bis-Phenol-A, 4,4′-dihydroxydiphenyl ketone (and its derivatives), 4,4′-dihydroxysulfone (and its derivatives), Biphenol (and its derivatives)

Where $Ar(OH)_2$ is selected from dihydroxybenzene, dihydroxynaphthalene, dihydroxyanthracene, and all isomers thereof.

Scheme 3.

| LINK | X | R | Ar |
|------|---|---|----|
| C=O | F | Substituted or unsubstituted benzene, naphthalene, anthracene, or phenanthracene, Triarylamine, thiophene, thienothiophenes, fluorine, carbazole, benzothiophene, | Substituted or unsubstituted benzene, naphthalene, anthracene, or phenanthracene, Triarylamine, thiophene, thienothiophenes, fluorine, carbazole, benzothiophene, |
| SO₂ | F, Cl, Br, I | Substituted or unsubstituted benzene, naphthalene, anthracene, or phenanthracene, Triarylamine, thiophene, thienothiophenes, fluorine, carbazole, benzothiophene, | Substituted or unsubstituted benzene, naphthalene, anthracene, or phenanthracene, Triarylamine, thiophene, thienothiophenes, fluorine, carbazole, benzothiophene, |

Substitution on "R" groups and "Ar" groups can include substitution with, for example, $C_1$-$C_{10}$ alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen (F, Cl, Br, I), quarternary ammonium salt, sulfonate ester, sulfonate salt, carboxylic ester, ketone, semi-fluoroalkyl, perfluoroaryl, semi-fluoroaryl, aryl, alkylsilyl, arylsilyl, alkoxysilyl, and aryloxysilyl groups.

In one embodiment, the arylamine repeat moiety is an N,N,N',N'-tetraphenylbenzidine moiety, and the linking moiety is a carbonyl moiety; a synthetic scheme for the synthesis of such a poly(arylamine) ketone, Poly(1), is shown in Scheme 4.

Scheme 4: General synthesis of poly(arylamine) ketone Polymer 1 ("Poly(1)")

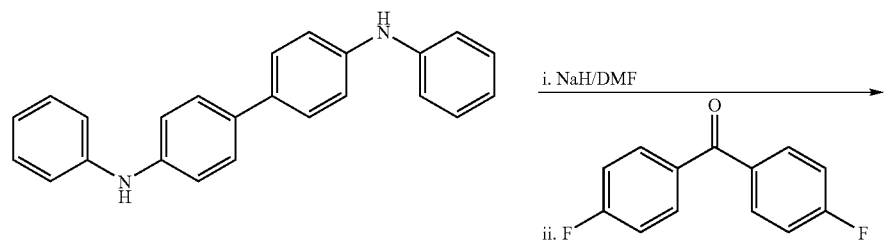

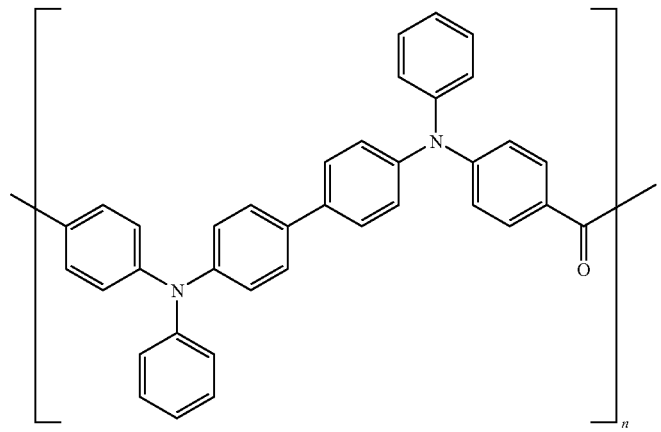

In another embodiment, the arylamine repeat moiety is an N,N,N',N'-tetraphenyl-1,4-phenylenediamine moiety, and the linking moiety is a carbonyl moiety; a synthetic scheme for the synthesis of such a poly(arylamine) ketone, Poly(2), is shown in Scheme 5.

Scheme 5:: General synthesis of poly(arylamine) ketone Polymer 2 ("Poly(2)").

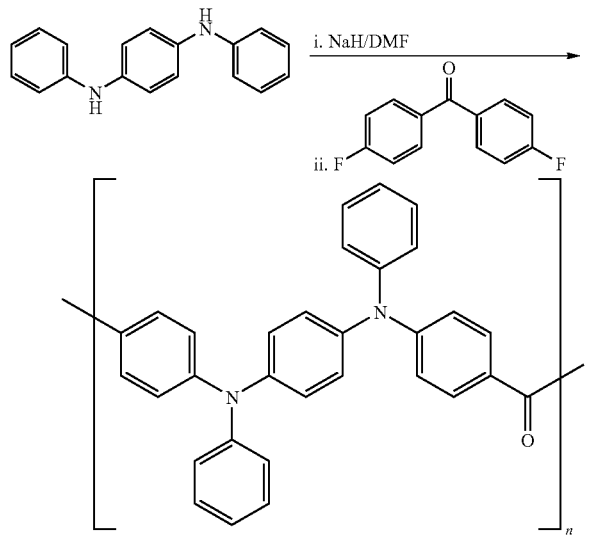

Polymers of the present application may be dissolved or suspended in any suitable solvent. Commonly, polymers of the present application may be dissolved or suspended in o-dichlorobenzene, ethyl benzoate, cyclohexanone, chlorobenzene, toluene, and mixtures thereof.

Polymer Properties

The polymer can have a relatively high glass transition temperature such as, for example, at least 100° C., or at least 130° C., or at least 160° C., or at least 180° C. An upper limit can be, for example, less than 400° C., or less than 300° C. The polymer can be generally free of a melting temperature. The polymer can have a decomposition temperature of, for example, at least 450° C., or at least 500° C., or at least 550° C. Decomposition temperature can be, for example, less than about 800° C., or less than about 600° C.

Cyclic voltametry can be used to measure properties such as HOMO and be more negative than −5.0 eV. Oxidation onset can be, for example, about 0.25 to about 0.75 (see working examples for units).

Dopants

The present compositions optionally comprise one or more dopants.

Dopants are typically used to obtain a desired conductive state for a polymer component of an HIL or HTL and often result in improved device performance. For example, upon oxidation of a conjugated conductive polymer by a redox dopant, electrons are removed from the valence band of the conductive polymer. This change in oxidation state results in the formation of new energy states for the polymer. The energy levels are accessible to some of the remaining electrons in the valence band, allowing the polymer to function as a conductor.

In the present compositions, in particular, the arylamine polymer can be doped with a redox dopant. Examples of suitable redox dopants that are known in the art include, but are not limited to, quinones, tetracyanoquinone including optionally substituted forms, iminoquinones, boranes, carbocations, bora-tetraazapentalenes, aminium or ammonium salts, sulfonium salts, oxonium salts, selenonoium salts, nitrosonium salts, arsonium salts, phosphonium salts, iodonium salts, select metal (e.g. silver) salts, or combinations thereof. Suitable redox dopants include, but not limited to, those disclosed in U.S. Pat. Nos. 5,853,906 and 5,968,674, which are hereby incorporated by reference in their entireties.

The redox dopant can also be selected to provide a suitable charge balancing counter-anion. The type of dopant anion can affect the doping level of the conductive polymer and the device performance for devices prepared from these solutions.

The size of the dopant anion can be an important parameter for enhancing the efficiency of a device. The anion can be a borate anion, a hexafluorophosphate anion, antimoniate, a sulfonate anion, a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, or an optionally substituted tetraalkylborate anion.

In the final compositions, the composition can be distinctly different from the combination of original components (i.e., arylamine polymer and/or redox dopant may or may not be present in the final composition in the same form before mixing). Thus, the arylamine polymer and the dopant, or redox dopant, can refer to components that will react to form a doped arylamine polymer. In addition, some embodiments allow for removal of reaction byproducts from the doping process. For example, the iodonium redox dopant can result in organic byproducts that can be washed away from the doped polymer.

In some embodiments, the redox dopant is a photoacid. Examples of suitable photoacids include, but are not limited to, onium salts such as sulfonium and iodonium salts, for example, as described in *Journal of Polymer Science Part A, Polymer Chem.* 37, 4241-4254, 1999, hereby incorporated by reference in its entirety.

Iodonium salts are known in the art. Doping of a conductive polymer, such as a neutral poly(arylamine), can be achieved using photoacids such as iodonium salts or diaryl iodonium salts, and in particular, diphenyl iodonium salts. The aryl groups, such as a phenyl group in the iodonium salt, can be optionally substituted as known in the art. For example, the redox dopant may be a lipophilic iodonium salt. Typically, the iodonium salt is represented by:

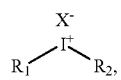

wherein independently $R_1$ is an optionally substituted aryl group, independently $R_2$ is an optionally substituted aryl group, and $X^-$ is an anion.

Doping of a neutral poly(arylamine) can also be achieved using a photoacid such as a sulfonium salt. Sulfonium salts are known in the art. The aryl groups in the sulfonium salt can be optionally substituted as known in the art. Typically, the sulfonium salt is represented by:

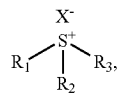

wherein independently $R_1$ is an optionally substituted arene, independently $R_2$ is a optionally substituted arene, $R_3$ is a optionally substituted arene, and $X^-$ is an anion.

The dopant can comprise an optionally substituted diphenyl iodonium salt with a molecular weight of, for example, about 100 g/mol to about 500 g/mol, or approximately 300 g/mol.

In some embodiments, the dopant is the photoacid 4-isopropyl-4'-methyldiphenyliodonium tetrakis(pentafluorophenylborate) (IMDPIB(PhF$_5$)$_4$), represented by:

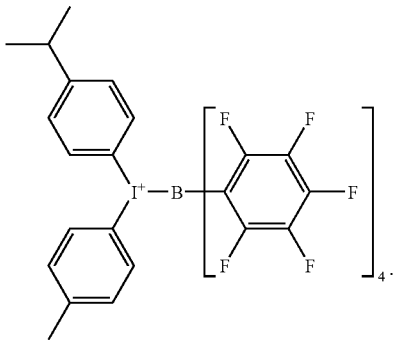

Examples of other iodonium salts that may be used, include, but are not limited to, diphenyliodonium hexafluorophosphate (DPIPF$_6$), diphenyliodonium para-toluene sulfonate (DPITos), bis-(4-tert-butylphenyl) iodonium trifluoromethane sulfonate ($^t$BDPITFSO$_3$), and diphenyliodonium perfluoro-1-butane sulfonate (DPIPFBSO$_3$). The iodonium salt can be a low molecular weight compound or it can be coupled to a high molecular compound such as a polymer.

The redox dopant may be a sulphonium salt. Examples of suitable sulphonium salts include, but are not limited to, triphenylsulphonium hexafluorophosphate, triphenylsulphonium para-toluene sulfonate, bis-(4-tert-butylphenyl) sulphonium trifluoromethane sulfonate, and diphenylsulphonium perfluoro-1-butane sulfonate.

Other onium salts may be used provided such that effective doping can be achieved for select counterions.

Another class of dopants that can be used includes quinones. Examples of suitable quinones that may be used to effect doping include, but are not limited to, tetrafluorotetracyano-p-quinodimethane (F$_4$TCNQ), trifluorotetracyano-p-quinodimethane (F$_3$TCNQ), difluorotetracyano-p-quinodimethane (F$_2$TCNQ), fluorotetracyano-p-quinodimethane (FTCNQ), dichloro dicyanoquinine (DDQ), o-chloranil, and cyanil.

Another class of dopants that can be used includes amminium salts. Amminium radical cations can be used as a redox additive to the formulation to undergo electron transfer. The byproducts formed need not necessarily be removed from the composition, as they are also hole transporting moieties and are less likely to adversely affect transport. Examples of suitable amminium salts include, but are not limited to, tris-(4-bromophenyl)amine antimony hexachloride.

Other useful redox dopants include bora-tetraazapentalenes. Examples of a bora-tetraazapentalene are represented by:

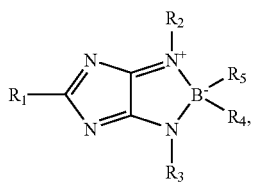

wherein $R_1$, $R_2$, $R_3$ are independently hydrogen, an optionally substituted or unsubstituted alkyl, a heteroalkyl, an aryl, a heteroaryl, a fused carbocycle or a fused heterocycle group, and wherein independently $R_4$ and $R_5$ are a halogen, hydrogen, an optionally substituted or unsubstituted alkyl, a heteroalkyl, an aryl, a heteroaryl, a fused carbocycle or fused heterocycle, or, together with the boron atom, a boron-containing heterocycle.

Another class of useful dopants is a silver salt, such as silver tetrafluoroborate, silver tetraphenylborate, silver hexafluorophosphate. Silver ions may undergo electron transfer to or from silver metal and the conductive polymer salt.

In some embodiments, the dopant may comprise tris(4-dibromophenyl)-aminium hexachloroantimonate ("TBPAH").

In some embodiments, the dopant may comprise tris(pentafluorophenyl)borane ("F5P3B").

Additional embodiments of combinations of polymer and dopant are provided in the below working examples. In addition, an embodiment is the combination of the polymer Poly (1) in the working examples with TBPAH (tris-(4-bromophenyl)-aminium hexachloroantimonate.

Ink Formulations

In preparing the present ink compositions, the dopant is typically combined with the conductive polymer, to ensure that doping of the conducting polymer occurs. For example, in some embodiments, the composition is an ink formulation that is prepared by combining the arylamine polymer with the dopant to form a polymer-dopant mixture. Typically, a stock solution of the arylamine polymer (e.g., one made by dissolving or dispersing the arylamine polymer in an organic solvent or organic solvent mixture) is combined with a stock solution of the dopant, to form a polymer-dopant solution.

Amounts

The present compositions can comprise between about 1% and 100% by weight ("wt %," or "% (w/w)") of the arylamine polymer, and, if a dopant is present, between about 0% and 75% by weight dopant. Weight percentages for each component are calculated on the basis of the weight of all solids in the composition.

For example, in some embodiments, the compositions comprise about 10% to about 90%, about 15% to about 80%, about 25% to about 75%, about 30% to about 70%, or about 35% to about 65% by weight of the arylamine polymer with respect to the total amount of arylamine polymer and dopant present.

In some embodiments, the compositions comprise about 10% to about 80%, about 15% to about 70%, or about 20% to about 60%, by weight of the dopant with respect to the total amount of arylamine polymer and dopant.

In addition, the dopant can be present in an amount that corresponds to the molar amount of repeat units of the conductive conjugated polymer (i.e., moles of dopant per repeat unit). For example, the dopant is typically present in the composition in an amount of about 0.01 moles dopant/moles conductive polymer repeat unit ("m/ru") to about 1 m/ru, wherein m is the molar amount of dopant and ru is the molar amount of conductive polymer repeat units. In some embodiments, the dopant is present in an amount of about 0.01 m/ru to about 1 m/ru.

Devices

The present compositions can be used to produce HILs/HTLs that can be incorporated into a number of organic electronic devices. HIL/HTL layers can be prepared for these devices from the present compositions using methods known in the art, including, for example, solution or vacuum processing, as well as printing and patterning processes.

Examples of organic electronic devices that can be fabricated from the present compositions include, but are not limited to, OLEDs, PLEDs, PHOLEDs, SMOLEDs, ESDs, photovoltaic cells, as well as supercapacitors, hybrid capacitors, cation transducers, drug release devices, electrochromics, sensors, FETs, actuators, and membranes. Another application is as an electrode modifier including an electrode modifier for an organic field effect transistor (OFETS). Other applications include those in the field of printed electronics, printed electronics devices, and roll-to-roll production processes. Additionally, the compositions discussed herein may be a coating on an electrode.

Methods known in the art can be used to fabricate each of these electronic devices, in particular, for fabricating OLED and OPV devices.

For example, the present compositions can be used to form HILs for OLED devices. OLED devices are known in the art. See, for example, Organic Light-Emitting Materials and Devices, (Ed. Li, Meng), 2007; US Patent Appl. Publ. No. US 2006/00787661 A1, published Apr. 13, 2006. See also Hammond et al., US Patent Appl. Publ. No. US 2006/0175582 A1, published Aug. 10, 2006, entitled "Hole Injection/Transport Layer Compositions and Devices." The devices can comprise, for example, multi-layer structures that include, for example, an anode, including a transparent conductor such as ITO on glass or PET or PEN; a hole injection layer; an electroluminescent layer such as a polymer layer; a conditioning layer such as LiF, and a cathode such as for example Ca, Al, or Ba. See also U.S. Pat. Nos. 4,356,429 and 4,539,507 (Kodak).

Materials for and methods of preparing each of these layers or components are well known in the art. For example, conjugated polymers which emit light, for use in electroluminescent layers in OLEDS, are described, for example, in U.S. Pat. Nos. 5,247,190 and 5,401,827 (Cambridge Display Technologies). See also Kraft et al., "Electroluminescent Conjugated Polymers—Seeing Polymers in a New Light," *Angew. Chem. Int. Ed.*, 1998, 37, 402-428, including device architecture, physical principles, solution processing, multilayering, blends, and materials synthesis and formulation, which is hereby incorporated by reference in its entirety. Light emitters known in the art and commercially available can be used, including various conducting polymers as well as organic molecules, such as materials available from Sumation, Merck Yellow, Merck Blue, American Dye Sources (ADS), Kodak (e.g, AlQ3 and the like), and even Aldrich such as BEHP-PPV. Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991). See also "Organic Light-Emitting Materials and Devices," Z. Li and H. Meng, Eds., CRC Press (Taylor and Francis Group, LLC), Boca Raton (2007), in particular, chapter 1 (pp. 1-44), chapter 2 (pp. 45-294), chapter 3 (pp. 295-412), and chapter 10 (pp. 617-638), for a fuller description of OLED components and layers.

Similarly, the present compositions can be used to form HTLs for organic photovoltaic devices (OPVs). OPVs are known in the art. See, for example, US Patent Publ. No. 2006/0076050, published Apr. 13, 2006; see also WO 2008/018931, published Feb. 14, 2008, including descriptions of OPV active layers. See also U.S. provisional Appl. No. 61/043,654, filed Apr. 9, 2008, by Williams et al., entitled "Hole Collection Layer Compositions and Photovoltaic Devices," which is herein incorporated by reference in its entirety. The devices can comprise, for example, multi-layer structures that include, for example, an anode, including a transparent conductor such as indium tin oxide (ITO) on glass or PET; a hole injection layer and/or a hole transport layer; a P/N bulk heterojunction layer; a conditioning layer such as LiF; and a cathode such as for example Ca, Al, or Ba. For example, a variety of photoactive layers can be used in OPV devices. Photovoltaic devices can be prepared with photoactive layers comprising fullerene derivatives mixed with, for example, conducting polymers as described in for example U.S. Pat. No. 5,454,880 (Univ. Cal.); U.S. Pat. Nos. 6,812,399; and 6,933,436. Also, photoactive layers may comprise blends of conducting polymers, blends of conducting polymers and semiconducting nanoparticles, and bilayers of small molecules such as pthalocyanines, fullerenes, and porphyrins. See also, for OPV device and materials disclosure, Organic Photovoltaics, (Sun, Sariciftci, Eds.).

Device Performance Measurements

The fabricated devices can be tested for device performance using methods known in the art. For example, for OLEDs, methods known in the art can be used to measure such device performance parameters as brightness, efficiency, and lifetime.

Methods known in the art can be used to measure OLED performance parameters. Device performance measurements are typically carried out at 10 mA/cm2. One method that can be used to measure OLED device performance parameters of current density (mA/cm2), operating voltage (V), brightness (cd/m2), and efficiency (cd/A) is now described: OLED devices can comprise pixels on a glass substrate whose electrodes extend outside the encapsulated area of the device which contains the light-emitting portion of the pixels. The typical area of each pixel in such devices can be 0.05 cm2. To test the devices, the electrodes are contacted with a current source meter, such as a Keithley 2400 source meter, with a bias applied to the indium tin oxide electrode while the aluminum electrode is earthed. This procedure results in positively charged carriers (holes) and negatively charged carriers being injected into the device which form excitons and generate light.

Another Keithley 2400 source meter can be used to address a large area silicon photodiode. This photodiode can be maintained at zero volts bias by the 2400 source meter and placed in direct contact with area of the glass substrate directly below the lighted area of the OLED pixel. The photodiode can be used to collect the light generated by the OLED device, converting it into photocurrent, which is in turn read by the source meter. The photodiode current generated may be quantified into optical units (candelas/sq. meter) by calibrating it with the help of a Minolta CS-200 Chromameter.

Voltage-current-light or IVL data for the OLED pixels of OLED devices can be generated as follows: During the testing of the device, the Keithley 2400 source meter addressing the OLED pixel applies a voltage sweep to it. The resultant current passing through the pixel is then measured. At the same time, the current passing through the OLED pixel results in light being generated, which then results in a photocurrent reading by the other Keithley 2400 source meter connected to the photodiode. This in turn enables the measurement of other device characteristics, such as the lumens per Watt of electrical input power to the pixel and candelas per ampere of pixel current OLED devices can also be tested for their lifetime performance. Lifetime performance can be measured using lifetime testers, where a constant current is sourced through the tested devices. The current to the device is adjusted so that it gives a certain initial luminance value. For lifetime performance tests, this value is typically set at 1,000 candela/meter$^2$. The luminance decay and voltage rise over time are then noted.

Examples of typical OLED parameters are as follows: Typical OLED device voltages can be, for example, from about 2 to about 15, or about 2 to about 8, or about 2 to 5, or from about 3 to about 14, or from about 3 to about 7. Typical device brightness can be, for example, at least 250 cd/m², or at least 500 cd/m², or at least 750 cd/m², or at least 1,000 cd/m². Typical device efficiencies can be, for example, at least 0.25 cd/A, or at least 0.45 cd/A, or at least 0.60 cd/A, or at least 0.70 cd/A, or at least 1.00 cd/A, or at least 2.5 cd/A, at least 4.00 cd/A, or at least 5.00 cd/A. Typical device lifetimes can be measured at 50 mA/cm² or up to 75 mA/cm² in hours and can be, for example, at least 50 hours, or at least 100 hours, or at least about 900 hours, or at least 1,000 hours, or at least 1100 hours, or at least 2,000 hours, or at least 5,000 hours, or at least 10,000 h, or at least 20,000 h, or at least 50,000 h.

The present compositions, when used as HILs or HTLs in organic devices, typically lead to increases in device parameters such as efficiency. For example, in some embodiments, the present compositions, when used as HILs in OLEDs, can lead to increases in efficiency of at least 5%, or at least about 10% or greater compared to OLEDs fabricated using traditional HILs.

Additional embodiments are provided with a series of non-limiting working examples

WORKING EXAMPLES

Various claimed embodiments are described further with use of non-limiting working examples.

Example 1

Synthesis of Polymer 1 ("Poly(1)")

To a clean, flame-dried, nitrogen-purged 250 mL 2-neck ring necked flask was added 5 g of N,N'-diphenyl benzidine (Aldrich, 97%) followed by 150 mL anhydrous N,N-dimethylformamide ("DMF"; Acros). Upon dissolution of the benzidine in the solvent, 0.75 g sodium hydride powder (Aldrich) was added to the reaction mixture. The reaction mixture turned opaque orange in color. The reaction mixture was stirred at room temperature under nitrogen flow for 30 minutes. To the reaction mixture was then added 3.24 g 4,4'-difluorobenzophenone. The reaction mixture turned deep red in color. The flask was heated to 100° C. using an oil bath, the reaction was allowed to continue for 14 hours. To the reaction mixture was added 0.16 g 4,4'-difluorobenzophenone to quench polymerization, and heating was continued for another 5 hours at 100° C. The polymer was precipitated by adding 500 mL methanol (semi-conductor grade, PURANAL from Aldrich) to the reaction mixture. The resulting light-yellow solids were filtered on a hydrophilic membrane filter (Millipore #SVLP09050) under suction and were washed with methanol until the filtrate was colorless. The washed solids were dried in vacuo at room temperature for 48 hours and then subjected to Soxhlet extraction using methanol (Chromasolv, Aldrich) until the extract was colorless. After Soxhlet extraction, the solids were dried along with the thimble in vacuo at room temperature for 5 hours to obtain about 5.7645 g polymer. About 5.28 g of the dried polymer were then dissolved in 170 mL anhydrous o-dichlorobenzene with heating to about 80-100° C. using a heating mantle. The warm (about 50° C.) orange-red solution was then filtered through a glass microfiber filter (Whatman #1810-090) under suction. The polymer was obtained as a light-yellow solid by precipitating into 750 mL methanol (Chromasolv, Aldrich). The polymer solids were filtered over a membrane filter (Millipore #SVLP09050) and were washed twice with 150 mL methanol. The polymer was initially dried over the filter. The polymer was then transferred to a glass vial and dried in a vacuum oven at 75° C. for 14 hours, yielding 4.2 g of Poly(1).

Example 2

Synthesis of Polymer 2 ("Poly(2)")

To a clean, flame-dried, nitrogen-purged 250 mL 2-neck ring necked flask was added 5 g of N,N'-diphenyl-1,4-phenylenediamine (Aldrich, 97%) followed by 150 mL anhydrous N,N-dimethylformamide ("DMF"; Acros). Upon dissolution of the phenylenediamine in the solvent, 0.97 g sodium hydride powder (Aldrich) was added to the reaction mixture. The reaction mixture turned dark green in color. The reaction mixture was stirred at room temperature under nitrogen flow for 30 minutes. To the reaction mixture was then added 4.19 g 4,4'-difluorobenzophenone. The reaction mixture turned deep red in color. The flask was heated to 100° C. using an oil bath, the reaction was allowed to continue for 14 hours. To the reaction mixture was added 0.21 g 4,4'-difluorobenzophenone to quench polymerization, and heating was continued for another 5 hours at 100° C. The polymer was precipitated by adding 750 mL methanol (semi-conductor grade, PURANAL from Aldrich) to the reaction mixture. The resulting light greenish-yellow solids were filtered on a hydrophilic membrane filter (Millipore #SVLP09050) under suction and were washed with methanol until the filtrate was colorless. The washed solids were then subjected to Soxhlet extraction using methanol (Chromasolv, Aldrich) until the extract was colorless. After Soxhlet extraction, the solids were dried along with the thimble in vacuo at room temperature for 5 hours to obtain about 7.4288 g polymer. All 7.4288 g of the dried polymer were then dissolved in 170 mL anhydrous o-dichlorobenzene with heating to about 80-100° C. using a heating mantle. The warm (about 50° C.) solution was then filtered through a glass microfiber filter (Whatman #1810-090) under suction. The polymer was obtained as a greenish-yellow solid by precipitating into 1 L methanol (Chromasolv, Aldrich). The polymer solids were filtered over a membrane filter (Millipore #SVLP09050) and were washed with 500 mL methanol. The polymer was refluxed in 300 mL methanol (Puranal, Aldrich) for 1 hour and then filtered over a membrane filter (Millipore #SVLP09050). The polymer was further washed with 200 mL methanol, dried over the filter initially, and then finally in a vacuum oven at 75° C. for 14 hours, yielding 5.8 g of Poly(2).

Example 3

Analysis of NPB, Poly(1) and Poly(2) by Cyclic Voltammetry

Oxidation potentials and HOMO values for N—N'-bis(1-naphthalenyl)-N—N'-bis(phenyl)benzidine (NPB), ("NPB"), Poly(1), and Poly(2) were measured using cyclic voltammetry, and are shown in Table 1 below. A 5 mM solution of NPB was prepared by dissolving NPB in a 0.1 M solution of tetra-n-butylammonium hexafluorophosphate in acetonitrile ("TBAPF6/ACN"). Poly(1) and Poly(2) were measured in TBAPF6/ACN as thin films coated on a platinum button electrode.

TABLE 1

Oxidation potentials and HOMO values of NPB, poly(1) and poly(2)

| Sample | $E_{ox, onset}$ (V vs Fc/Fc$^+$) | HOMO (eV) |
|---|---|---|
| NPB[a] | 0.39 | −5.2 |
| Poly(1)[b] | 0.55 | −5.36 |
| Poly(2)[b] | 0.34 | −5.16 |

*Measured by cyclicvoltammetry in 0.1 M TBAPF$_6$/ACN as
[a] 5 mM dissolved in 0.1M TBAPF6/ACN
[b] as thin film coated on a Pt button electrode

Example 4

Thermal Analysis of Poly(1) and Poly(2)

The glass transition temperatures ("$T_g$"), melting points ("$T_m$"), and decomposition onset temperatures ("$T_{decomp,onset}$") were determined for Poly(1) and Poly(2), and are shown in Table 2 below. The glass transition temperatures of the polymers were obtained using a TA Instruments (DSCQ200) Differential Scanning Calorimeter at a ramp rate of 20° C./min. Decomposition temperatures were obtained using a (TGAQ500) thermgravimetric analyzer at a ramp rate of 50° C./min.

TABLE 2

Thermal analysis data of poly(1) and poly(2)

| Polymer | $T_g/T_m$ (° C.) | $T_{decomp, onset}$ (° C.) |
|---|---|---|
| Poly(1) | 182.4° C. No Tm | 563.5° C. |
| Poly(2) | 179.4° C. No Tm | 541.6° C. |

Example 5

HIL Inks Prepared with Poly(1) and Poly(2)

A series of HIL ink formulations were prepared containing Poly(1) or Poly(2), a dopant comprising (IMDPIB(PhF$_5$)$_4$), TBPAH, or F5P3B, and various solvents, including o-dichlorobenzene ("o-DCB"), cyclohexanone ("CHN"), chlorobenzene ("CB"), ethyl benzoate ("EB"), and toluene ("TOL"), as shown in Table 3 below.

TABLE 3

Composition of Hole-Injection Inks Prepared Using Poly(1) with IMDPIB(PhF$_5$)$_4$ as Dopant

| HIL # | Polymer | Polymer wt. % | Dopant wt. % | Solvent 1 | Solvent 2 | Solvent 1 wt. % | Solvent 2 wt. % |
|---|---|---|---|---|---|---|---|
| 1 | Poly(1) | 0.72 | 0.28 | o-DCB | CB | 66 | 33 |
| 2 | Poly(1) | 0.63 | 0.37 | o-DCB | CB | 66 | 33 |
| 3 | Poly(1) | 0.56 | 0.44 | o-DCB | CB | 66 | 33 |
| 4 | Poly(1) | 0.84 | 0.16 | EB | CB | 86.62 | 12.38 |
| 5 | Poly(1) | 0.72 | 0.28 | EB | CB | 86.62 | 12.38 |
| 6 | Poly(1) | 0.63 | 0.37 | EB | CB | 86.62 | 12.38 |
| 7 | Poly(1) | 0.72 | 0.18 | o-DCB | CB | 44.50 | 44.50 |
| 8 | Poly(1) | 0.63 | 0.37 | o-DCB | CB | 44.50 | 44.50 |
| 9 | Poly(1) | 0.56 | 0.44 | o-DCB | CB | 44.50 | 44.50 |
| 10 | Poly(1) | 1 | — | o-DCB | — | 99.00 | — |
| 11 | Poly(1) | 0.91 | 0.09 | o-DCB | — | 99.00 | — |
| 12 | Poly(1) | 0.84 | 0.16 | o-DCB | — | 99.00 | — |
| 13 | Poly(1) | 0.72 | 0.18 | o-DCB | — | 99.00 | — |
| 14 | Poly(1) | 0.63 | 0.37 | o-DCB | — | 99.00 | — |
| 15 | Poly(1) | 0.56 | 0.44 | o-DCB | — | 99.00 | — |
| 16 | Poly(1) | 0.72 | 0.18 | CHN | — | 99.00 | — |
| 17 | Poly(1) | 0.63 | 0.37 | CHN | — | 99.00 | — |
| 18 | Poly(1) | 0.56 | 0.44 | CHN | — | 99.00 | — |

% indicated are on weight basis, with respect to total weight of the composition (%(w/w))

TABLE 4

Composition of Hole-Injection Inks Prepared Using Poly(1) with F5P3B as Dopant

| HIL # | Polymer | Polymer wt. % | Dopant wt. % | Solvent 1 | Solvent 2 | Solvent 1 wt. % | Solvent 2 wt. % |
|---|---|---|---|---|---|---|---|
| 19 | Poly(1) | 0.83 | 0.17 | o-DCB | — | 99.00 | — |
| 20 | Poly(1) | 0.71 | 0.29 | o-DCB | — | 99.00 | — |
| 21 | Poly(1) | 0.63 | 0.37 | o-DCB | — | 99.00 | — |
| 22 | Poly(1) | 2.00 | 0.4 | EB | 97.6 | — | — |
| 23 | Poly(1) | 2.00 | 0.79 | EB | 97.2 | — | — |
| 24 | Poly(1) | 2.00 | 1.19 | EB | 96.8 | — | — |

% indicated are on weight basis, with respect to total weight of the composition (%(w/w))

TABLE 5

Composition of Hole-Injection Inks Prepared Using Poly(2) with IMDPIB(PhF$_5$)$_4$ as Dopant

| HIL # | Polymer | Polymer wt. % | Dopant wt. % | Solvent 1 | Solvent 2 | Solvent 1 wt. % | Solvent 2 wt. % |
|---|---|---|---|---|---|---|---|
| 25 | Poly(2) | 0.68 | 0.32 | CHN | TOL | 24.75 | 74.25 |
| 26 | Poly(2) | 0.59 | 0.41 | CHN | TOL | 24.75 | 74.25 |
| 27 | Poly(2) | 0.52 | 0.48 | CHN | TOL | 24.75 | 74.25 |
| 28 | Poly(2) | 2.00 | 0.47 | EB | 97.5 | — | — |
| 29 | Poly(2) | 2.00 | 0.93 | EB | 97.07 | — | — |
| 30 | Poly(2) | 2.00 | 1.40 | EB | 96.4 | — | — |

% indicated are on weight basis, with respect to total weight of the composition (%(w/w))

TABLE 6

Composition of Hole-Injection Inks Prepared Using Poly(2) with TBAH as Dopant

| HIL # | Polymer | Polymer wt. % | Dopant wt. % | Solvent 1 | Solvent 2 | Solvent 1 wt. % | Solvent 2 wt. % |
|---|---|---|---|---|---|---|---|
| 31 | Poly(2) | 0.73 | 0.27 | CHN | TOL | 33.00 | 66.00 |
| 32 | Poly(2) | 0.64 | 0.36 | CHN | TOL | 33.00 | 66.00 |
| 33 | Poly(2) | 0.57 | 0.43 | CHN | TOL | 33.00 | 66.00 |

% indicated are on weight basis, with respect to total weight of the composition (%(w/w))

The ink formulations were prepared using the following general procedure: Stock solutions of polymer and dopant in the solvent system were prepared in a dry-box and the formulations were prepared by adding the dopant solution to the polymer solution with or without stirring. In some instances the polymer solution may need to be heated to ensure complete dissolution and cooled before adding the dopant.

Example 6

Device Preparation and Testing Using HIL Formulations Prepared in Example 5

OLEDs were prepared using the following procedure: The OLED devices described herein were fabricated on indium tin oxide ("ITO") surfaces deposited on glass substrates. The ITO surface was pre-patterned to define the pixel area of 0.05 cm$^2$. The device substrates were cleaned by ultrasonication in a dilute soap solution for 20 minutes each followed by distilled water washes. This was followed by ultrasonication in isopropanol for 20 minutes. The substrates were dried under nitrogen flow, following which they were treated in a UV-Ozone chamber operating at 300 W for 20 minutes.

The cleaned substrates were then coated with an HIL ink and dried at 90-170° C. for 5-15 minutes to form an HIL layer. Dry film thicknesses ranged from approximately 20 nm to 60 nm. The coating process was done on a spin coater but can be similarly achieved with spray coating, ink-jetting, contact printing or any other deposition method capable of resulting in an HIL film of the desired thickness. The substrates were then transferred to a vacuum chamber where the remaining layers of the device stack were deposited by means of physical vapor deposition.

In this example, the layers deposited on top of the HIL include a hole transporting layer (HTL), an emissive layer (EML), a hole blocking layer (HBL), an electron transporting layer (ETL), and a metal cathode. The materials used in this example were N,N'(di naphthalen-1-yl)-N,N'-diphenyl-benzidine (NPB) as the HTL (40 nm), Bis(2-methyl-8-quinolinolato-N1,O8)-(1,1'-Biphenyl-4-olato)aluminum (BAlq) doped with Tris-(1-phenylisoquinoline) iridium III (Ir(piq)$_3$) for the EML (20 nm), BAlq as the HBL (10 nm), and either tris(8-hydroxyquinoline) aluminium (Alq3) as the ETL (40 nm) or generally equivalent materials. Both electron transport and electron injection layers were used in some cases.

Also in this example, the cathode layer was prepared by thermal evaporation. In the case of PHOLEDs with Alq3 as an ETL, sequential deposition of two metal layers created the cathode, the first being a 3 nm to 5 nm layer of Ca (0.1 nm/sec) followed by a 200 nm layer of Al (0.5 nm/sec) with the base pressure at 5×10$^{-7}$ Torr. In the case of PHOLEDs made with E246/EI101, the cathode consisted of a single layer of 200 nm thick aluminum (0.5 nm/sec) evaporated with a base pressure of 5×10$^{-7}$ Torr.

The devices thus obtained were encapsulated with a glass cover slip to prevent exposure to ambient conditions by means of a UV-light curing epoxy resin cured at 80 W/cm$^2$ UV exposure for 4 minutes.

OLED Testing

The OLEDs comprised pixels on a glass substrate whose electrodes extended outside the encapsulated area of the device which contain the light-emitting portion of the pixels. The typical area of each pixel is 0.05 cm$^2$. The electrodes were contacted with a current source meter such as a Keithley 2400 source meter with a bias applied to the indium tin oxide electrode while the aluminum electrode was earthed. This resulted in positively charged carriers (holes) and negatively charged carriers being injected into the device which form excitons and generate light. In this example, the HIL assisted the injection of charge carriers into the light emitting layer. This resulted in a low operating voltage of the device (defined as the voltage required to run a given current density through the pixel).

Simultaneously, another Keithley 2400 source meter was used to address a large area silicon photodiode. This photodiode was maintained at zero volts bias by the 2400 source meter. It was placed in direct contact with area of the glass substrate directly below the lighted area of the OLED pixel. The photodiode collected the light generated by the OLED converting them into photocurrent which was in turn read by the source meter. The photodiode current generated was quantified into optical units (candelas/sq. meter) by calibrating it with the help of a Minolta CS-200 Chromameter.

During the testing of the device, the Keithley 2400 addressing the OLED pixel applied a voltage sweep to it. The resultant current passing through the pixel was measured. At the same time the current passing through the OLED pixel results in light being generated which then results in a photocurrent reading by the other Keithley 2400 connected to the photodiode. Thus the voltage-current-light or IVL data for the pixel was generated. This in turn enabled the measurement of other device characteristics such as the lumens per Watt of electrical input power to the pixel and candelas per ampere of pixel current.

The performance of different HILs in different example OLED types is described. Note that typically performance is quantified by a combination of different parameters such as operating voltage (should be low), brightness in nits (should be bright), and luminous efficiency in units of cd/A (reflecting how much electric charge is needed to obtain light from the device). As such, the overall performance is very important in a comparative evaluation of HIL performance.

In the examples below, the voltages and efficiencies that are provided were measured at a fixed current density of 30 mA/cm$^2$. Data collected for each device are shown in Tables 7-10 below.

TABLE 7

| RUN | HIL# | Architecture | Efficiency (cd/A) | Voltage (V) |
|---|---|---|---|---|
| 3242 | Comparative | NPB/BAlq:Irpiq/BAlq/ | 3.11 | 9.62 |
| 3242 | 19 | ALq3/Ca/Al | 3.40 | 15.6 |
| 3242 | 21 | | 3.30 | 16.2 |

TABLE 8

| RUN | HIL# | Architecture | Efficiency (cd/A) | Voltage (V) |
|---|---|---|---|---|
| 3601 | Comparative | NPB/BAlq:Irpiq/BAlq/ | 3.72 | 8.30 |
| 3601 | 23 | ETL/EIL/Al | 3.67 | 9.99 |
| 3601 | 24 | | 3.33 | 9.75 |
| 3601 | 22 | | 3.51 | 11.36 |

TABLE 9

| RUN | HIL# | Architecture | Efficiency (cd/A) | Voltage (V) |
|---|---|---|---|---|
| 3729 | Comparative | NPB/BAlq:Irpiq/BAlq/ | 2.59 | 11.64 |
| 3729 | 13 | ETL/EIL/Al | 3.24 | 11.31 |
| 3729 | 14 | | 3.0 | 10.98 |
| 3729 | 15 | | 2.54 | 10.23 |

TABLE 10

| RUN | HIL# | Architecture | Efficiency (cd/A) | Voltage (V) |
|---|---|---|---|---|
| 3755 | Comparative | NPB/BAlq:Irpiq/BAlq/ | 4.89 | 11.43 |
| 3755 | 4 | ETL/EIL/Al | 4.85 | 11.53 |
| 3755 | 5 | | 4.65 | 11.59 |
| 3755 | 6 | | 4.86 | 11.16 |

The comparative HIL formulation in Tables 7-10 are:

| Material | Wt. % |
|---|---|
| P3MEET-S | 0.13 |
| Poly(4-vinylphenol) | 1.94 |
| Poly(styrenesulfonic acid) | 0.07 |
| Nafion | 0.07 |
| Water | 53.79 |
| Butyl Cellosolve | 44.01 |

Where P3MEET-S is a sulfonated poly(3-methoxyethoxyethoxythiophene), which was prepared as described in, for example, US patent publication 2008/0248313 published Oct. 9, 2008 (U.S. Ser. No. 11/826,394).

All references cited herein are incorporated by reference in their entirety.

What is claimed is:

1. An OLED device comprising a hole injection layer disposed next to a hole transport layer, wherein the hole injection layer comprises:
    at least one arylamine polymer; and
    at least one dopant;
wherein the arylamine polymer consists essentially of a backbone consisting essentially of at least one arylamine repeat moiety and at least one linking repeat moiety, wherein the arylamine repeat and linking repeat moieties are alternating moieties, and wherein the backbone is free of oxygen atoms, wherein the linking repeat moiety consists of a bivalent carbonyl group, a bivalent sulfone group, or a group >C=C(CN)R, wherein R is, H, CN, F, or alkyl, and does not comprise an aryl moiety, and wherein the backbone consists essentially of only one aryl group between the linking repeat moiety and the amine of the arylamine.

2. The device of claim 1, wherein the arylamine repeat moiety is substituted on at least one aryl group.

3. The device of claim 1, wherein the arylamine repeat moiety is substituted on at least one aryl group that does not comprise the polymer backbone.

4. The device of claim 1, wherein the arylamine repeat moiety is substituted with at least one C1-C10 alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen, quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, or aryloxysilyl group.

5. The device of claim 1, wherein the arylamine repeat moiety comprises an N,N,N'N'-tetraphenylbenzidine group, optionally including at least one C1-C10 alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen, quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, or aryloxysilyl group.

6. The device of claim 1, wherein the arylamine repeat moiety comprises an N,N,N'N'-tetraphenylbenzidine group including substitution on at least one aryl group that does not comprise the polymer backbone.

7. The device of claim 1, wherein the arylamine repeat moiety comprises an N,N,N'N'-tetraphenyl-1,4-phenylenediamine group, optionally including at least one C1-C10 alkyl, perfluoroalkyl, thioalkyl, alkoxy, alkylaryl, arylalkyl, aryloxy, heteroaryl, cyano, halo, alkylthio, trialkyl silyl, trialkoxysilyl, trialkyl silyloxy, hydroxyl, thioaryl, dialkylamine, diarylamine, cyano, halogen, quarternary ammonium salt, sulfonate ester, sulfonate salt, carboxylic ester, ketone, semifluoroalkyl, perfluoroaryl, semi-fluoroaryl, aryl, alkylsilyl, arylsilyl, alkoxysilyl, or aryloxysilyl group.

8. The device of claim 1, wherein the arylamine repeat moiety comprises an N,N,N'N'-tetraphenyl-1,4-phenylenediamine group substituted on at least one aryl group that is not part of the polymer backbone.

9. The device of claim 1, wherein the linking repeat moiety consists of a carbonyl group or a sulfone group.

10. The device of claim 1, wherein the dopant comprises tris(4-bromophenyl)-aminium hexachloroantimonate, or tris(pentafluorophenyl)borane, or 4-isopropyl-4'-methyldiphenyliodonium tetrakis(pentafluorophenylborate).

11. The device of claim 1, wherein the dopant is a silver salt.

12. The device of claim 1, wherein the linking repeat moiety consists of a bivalent carbonyl group or a bivalent sulfone group.

13. The device of claim 1, wherein the linking repeat moiety consists of a bivalent carbonyl group.

14. The device of claim 1, wherein the linking repeat moiety consists of a bivalent sulfone group.

* * * * *